(12) United States Patent
Barth et al.

(10) Patent No.: US 12,557,428 B2
(45) Date of Patent: Feb. 17, 2026

(54) METHODS FOR CURING A CONDUCTIVE PASTE AND MANUFACTURING A PHOTOVOLTAIC CHAIN AND ASSOCIATED EQUIPMENT

(71) Applicant: COMMISSARIAT À L'ENERGIE ATOMIQUE ET AUX ENERGIES ALTERNATIVES, Paris (FR)

(72) Inventors: Vincent Barth, Grenoble (FR); Jordi Veirman, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 467 days.

(21) Appl. No.: 18/084,998

(22) Filed: Dec. 20, 2022

(65) Prior Publication Data
US 2023/0197881 A1 Jun. 22, 2023

(30) Foreign Application Priority Data
Dec. 21, 2021 (FR) ........................................ 2114151

(51) Int. Cl.
*H10F 71/00* (2025.01)
*H10F 19/90* (2025.01)

(52) U.S. Cl.
CPC ......... *H10F 71/137* (2025.01); *H10F 19/902* (2025.01)

(58) Field of Classification Search
CPC .................................................... H10F 71/137
See application file for complete search history.

(56) References Cited

U.S. PATENT DOCUMENTS

| | | | | |
|---|---|---|---|---|
| 5,391,235 A | * | 2/1995 | Inoue | H10F 19/904 136/244 |
| 8,426,726 B2 | * | 4/2013 | Taira | H10F 19/906 438/98 |
| 2001/0054479 A1 | * | 12/2001 | Takemoto | C09J 5/00 156/275.5 |
| 2008/0117486 A1 | * | 5/2008 | Andoh | G02B 7/182 359/198.1 |
| 2018/0138354 A1 | | 5/2018 | Jaffrennou et al. | |
| 2018/0366596 A1 | | 12/2018 | Chang et al. | |
| 2019/0081198 A1 | * | 3/2019 | Morad | H10F 77/935 |
| 2019/0386164 A1 | * | 12/2019 | Shi | C09J 5/00 |

(Continued)

FOREIGN PATENT DOCUMENTS

| | | | |
|---|---|---|---|
| CN | 206685214 U | * | 11/2017 |
| FR | 3 099 294 A1 | | 1/2021 |
| WO | WO 2022/023221 A1 | | 2/2022 |

OTHER PUBLICATIONS

Search Report as issued in French Patent Application No. FR2114151, dated Aug. 1, 2022.

*Primary Examiner* — Bitew A Dinke
(74) *Attorney, Agent, or Firm* — Pillsbury Winthrop Shaw Pittman LLP

(57) ABSTRACT

A method for curing a portion of conductive paste disposed on a photovoltaic cell, the photovoltaic cell including a first face and a second face, the portion of conductive paste being disposed on one of the faces of the photovoltaic cell, the curing method including exposing the first face of the photovoltaic cell to a first electromagnetic radiation including at least one component between 300 nm and 700 nm.

14 Claims, 5 Drawing Sheets

(56) References Cited

U.S. PATENT DOCUMENTS

| | | | | |
|---|---|---|---|---|
| 2020/0373440 A1* | 11/2020 | Hilali | ................ | H10F 19/902 |
| 2023/0197881 A1* | 6/2023 | Barth | ................ | H10F 19/906 438/80 |

* cited by examiner

[FIG.1]
PRIOR ART
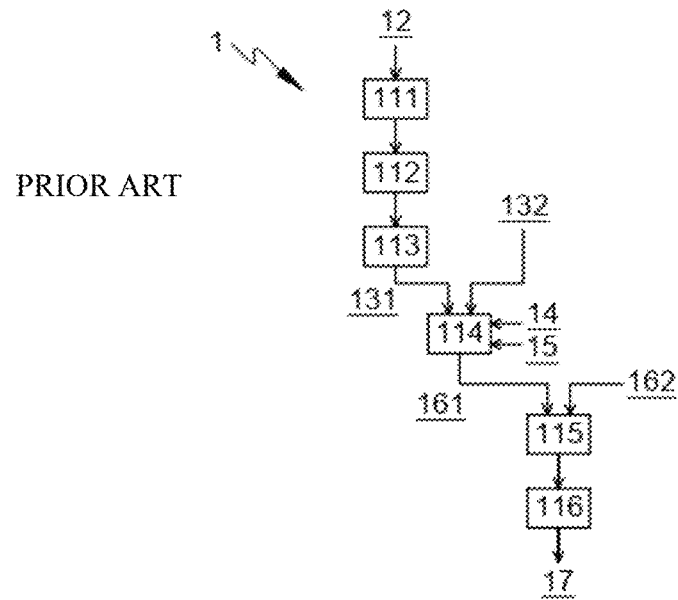
[FIG.2]
PRIOR ART
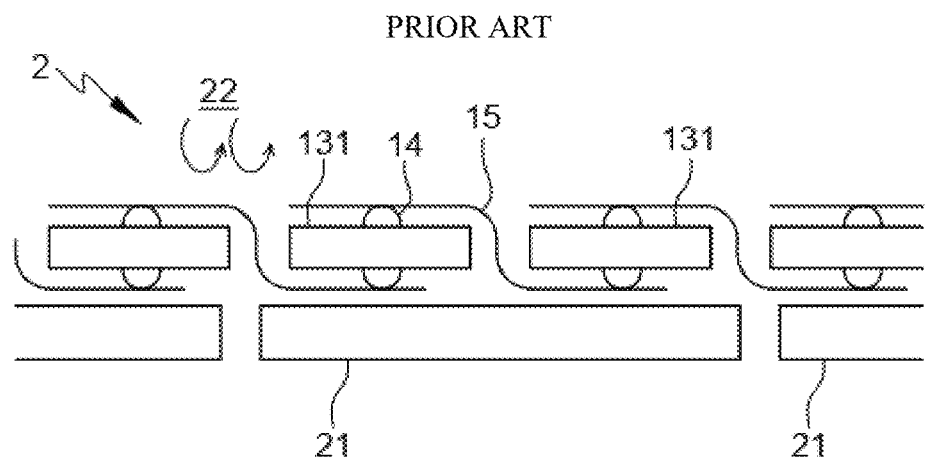
[Fig.3]
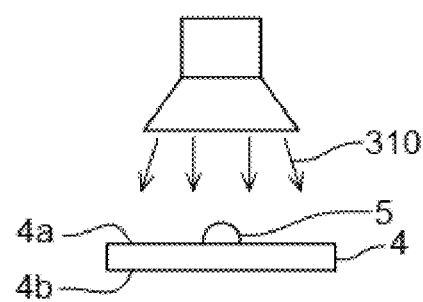

[Fig.4]
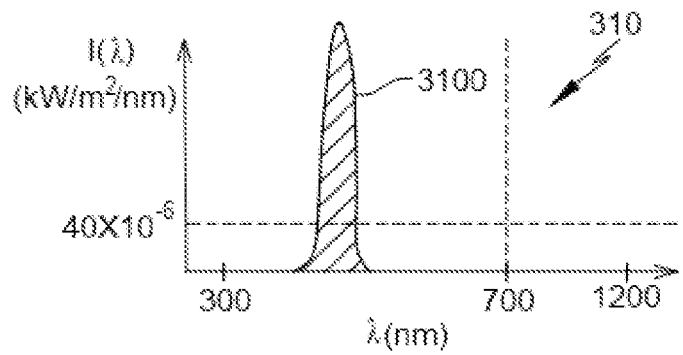
[Fig.5]
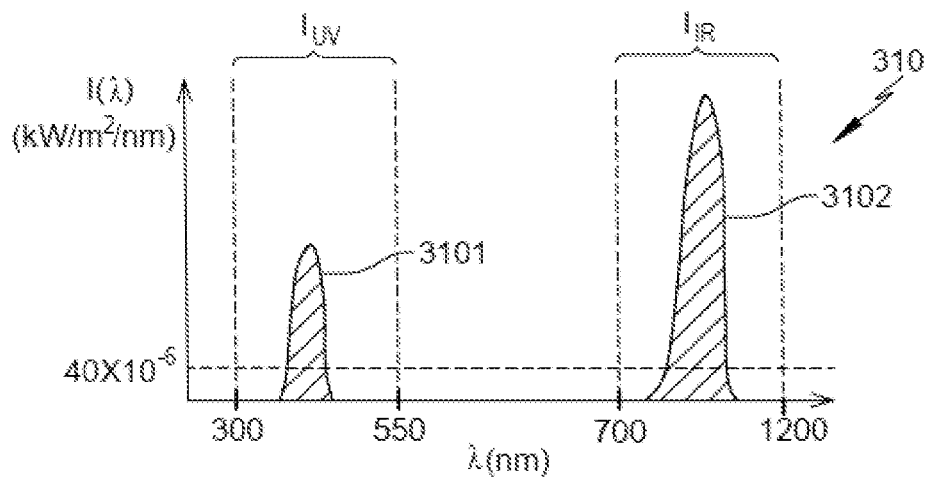
[Fig.6]
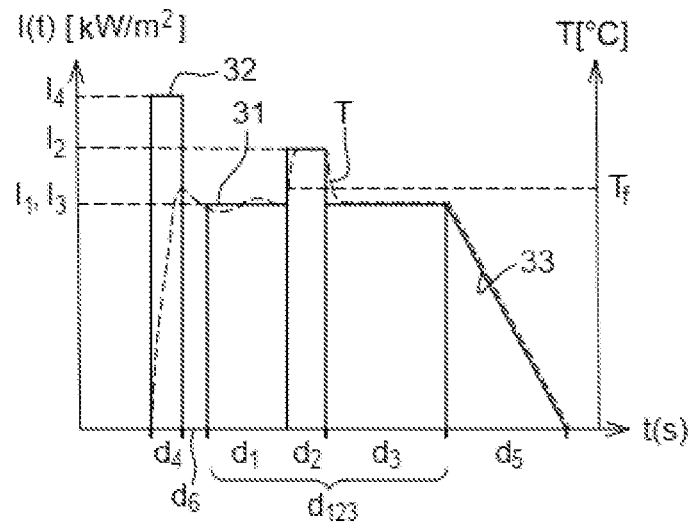

[Fig.7]
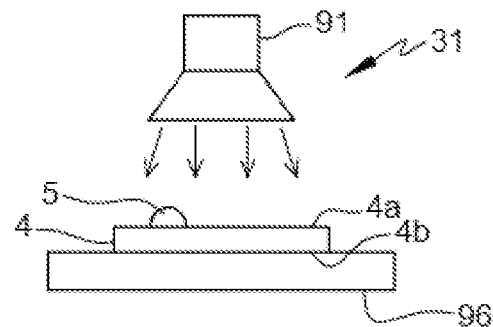
[Fig.8]
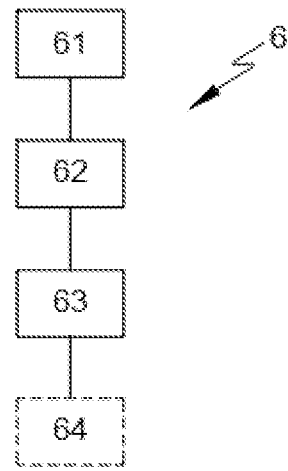
[Fig.9]
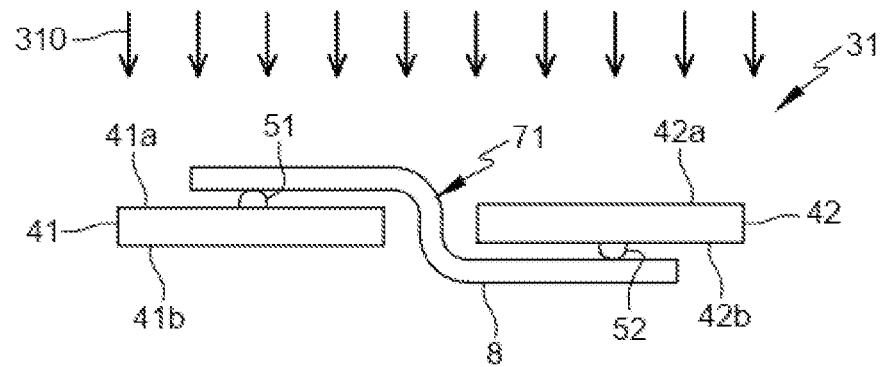

[Fig.10]
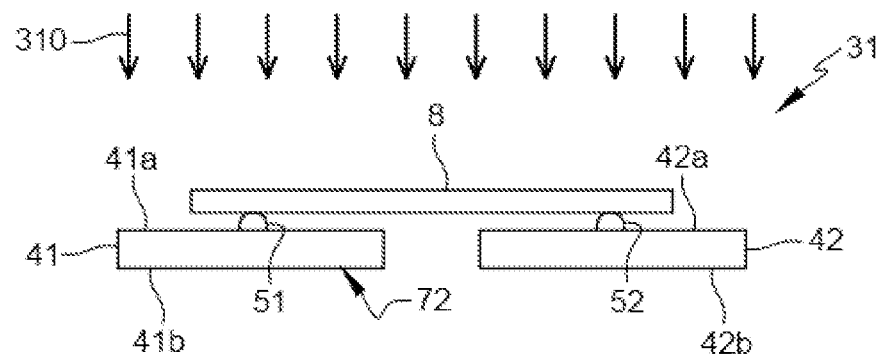
[Fig.11]
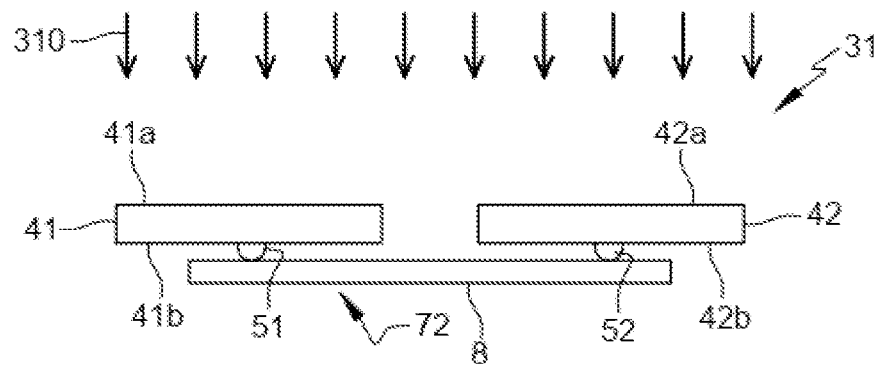
[Fig.12]
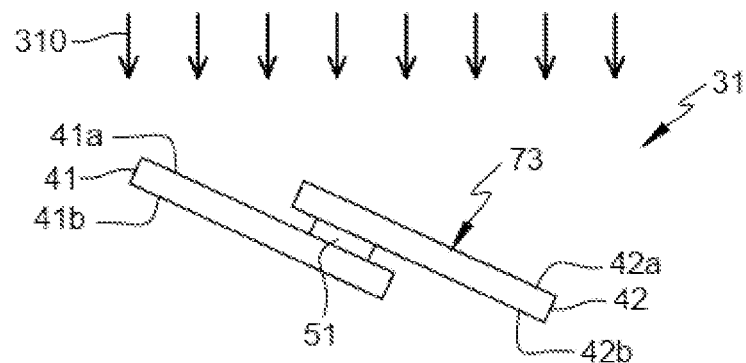

[Fig.13]
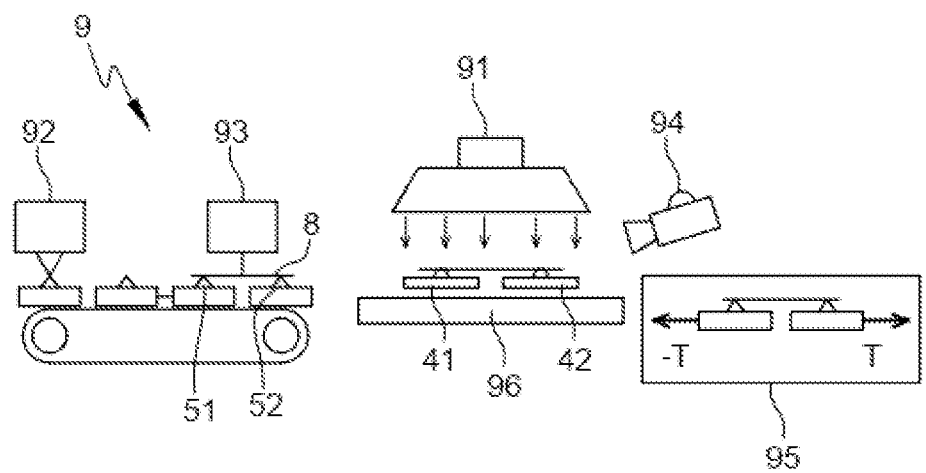

METHODS FOR CURING A CONDUCTIVE PASTE AND MANUFACTURING A PHOTOVOLTAIC CHAIN AND ASSOCIATED EQUIPMENT

TECHNICAL FIELD OF THE INVENTION

The technical field of the invention is that of curing a conductive paste in order to interconnect photovoltaic cells so as to form a photovoltaic chain.

TECHNOLOGICAL BACKGROUND OF THE INVENTION

Conversion of electromagnetic radiation into electric energy is achieved by photovoltaic cells having at least one face illuminated by said electromagnetic radiation. The photovoltaic cells can be connected to each other and arranged next to each other to form a compact assembly called a photovoltaic module.

FIG. 1 schematically represents an example of a method 1 for manufacturing a photovoltaic module 17 from a semiconductor substrate 12. In the example illustrated, this is a silicon heterojunction substrate.

The method 1 first comprises a step of cleaning and texturing 111 the substrate 12. This is followed by a step 112 of depositing a layer of amorphous silicon and transparent conductive oxide onto each face of the substrate 12 so as to protect them.

A metallisation step 113 makes it possible to form the conductive elements such as collection fingers and a busbar. At the end of the metallisation step 113, the substrate 12 forms a first photovoltaic cell 131, ready to be connected to an electrical system and to be exposed to radiation.

An interconnection step 114 allows the first cell 131 to be electrically connected in series with a second cell 132 to form a first photovoltaic chain 161 also called a photovoltaic string. A cell forms a PN type junction with a first face as a base and a second face as an emitter. By connecting the first and second cells 131, 132 in series, an electrical circuit is formed that is capable of generating an electric current at a voltage of a few volts. When the first chain 161 has up to sixty cells in series, it can generate an electric current at a voltage of between 35 V and 40 V.

The interconnection 114 of the first and second cells 131, 132 firstly comprises a first step of depositing of at least one portion of a conductive paste 14 onto one face of each cell 131, 132. In order to connect the cells 131, 132 in series, the conductive paste 14 is, for example, deposited onto the emitter of the first cell 131 and onto the base of the second cell 132. The interconnection 114 then comprises depositing a conductive wire or tape 15 so that it rests on each portion of conductive paste 14 of each cell 131, 132. Finally, the interconnection 114 comprises curing the conductive paste 14, electrically and mechanically connecting the conductive tape 15 to each cell 131, 132.

The first chain 161 is advantageously connected to at least one second chain 162 during a lay-up step 115. The first and second chains 161, 162 are disposed next to each other so as to form a compact assembly of photovoltaic cells. The chains 161, 162 are then connected in series to form an electrical system capable of generating significant electric power. The chains 161, 162 so connected and arranged are then inserted into a transparent matrix in a lamination step 116 so as to form an electrically connected and mechanically rigid assembly 17, called a photovoltaic module. The photovoltaic module 17 is a finished component implemented in the generation of electric energy.

A photovoltaic module 17 may exhibit electrical reliability problems due to a break in the electrical conductivity of a chain of said module. The break may be caused by a detachment of a conductive tape from a cured portion of conductive paste or a detachment of the cured portion of conductive paste from a cell.

The conductive paste implemented during the interconnection step 114 may be an electrically conductive adhesive. This is referred to as a bonding interconnection. An electrically conductive adhesive typically comprises an organic material based on epoxy, acrylate or other material capable of crosslinking upon heat treatment for a few seconds or minutes in the range of 150° C. to 250° C. This organic material is filled with a material having conductive properties, such as metal powders, such as silver powder, or metallised fillers on the surface.

The conductive paste may also be a solder paste. This is referred to as a solder interconnection. A solder paste generally comprises a matrix filled with a metal powder capable of melting or glass transitioning upon heat treatment for a few seconds to a few minutes at a temperature above 250° C.

FIG. 2 represents an example of equipment 2 for manufacturing a photovoltaic chain, also called interconnection equipment or stringer, which performs curing of the conductive paste 14 by means of heating plates 21 brought into contact with the cells 131, 132 for a given duration. The heating plates 21 are, for example, part of a conveyor supporting the cells. Each cell 131 is thermalised with the heating plates 21 to reach, after a few seconds or minutes, a stationary temperature, ideally in the range for curing the conductive paste 14. However, this thermalisation mode, involving thermal conduction and thermal convection 22, creates a thermal gradient on either side of each cell 131, 132. The temperature difference between the face in contact with a heating plate 21 and the opposite face, called free face, can reach several degrees, or even several tens of degrees. Moreover, the thermal conductivity of the cells and their thermal inertia mean that the free face heats up less quickly than the face in contact with a heating plate. The curing of the conductive paste 14 is therefore achieved differently depending on whether it is in contact with the free face or with the directly heated face and is therefore not optimal when the conductive paste 14 is deposited onto a free face.

Furthermore, cells made from a silicon heterojunction substrate have a limited thermal budget. Indeed, at a temperature above 200° C. for several seconds, layers forming a heterojunction cell can be damaged. It is therefore preferable to keep the maximum temperature of a heterojunction cell below 200° C., even upon curing the conductive paste. However, under these conditions, the temperature of the free face hardly reaches the cross-linking temperature of the adhesive, compromising the cross-linking thereof.

There is therefore a need to homogenise curing of the conductive paste on a photovoltaic cell.

SUMMARY OF THE INVENTION

A first aspect of the invention solves the problems discussed above by improving curing of the conductive paste deposited onto a face of a photovoltaic cell, regardless of which face it is deposited onto, in order to ultimately reduce the risk of failure of a photovoltaic module in operation.

For this, the first aspect of the invention relates to a method for curing a portion of conductive paste disposed on a photovoltaic cell, the photovoltaic cell comprising a first face and a second face, opposite to the first face, the portion of conductive paste being disposed on one of the first and second faces of the photovoltaic cell, the curing method comprising a first step of exposing the first face of the photovoltaic cell to a first electromagnetic radiation comprising at least one component between 300 nm and 700 nm.

By component or line, it is meant, for example, a restricted frequency range around a central frequency, a spectral irradiance being greater than 0.04 $W/m^2/nm$ within the restricted frequency range and less than 0.04 $W/m^2/nm$ outside it. By restricted frequency range, it is meant, for example, a frequency range extending over less than 10 nm.

By a component between two bounds, it is meant that the centre frequency of the restricted frequency range is between both bounds.

By virtue of the first electromagnetic radiation, curing does not require a heating plate. The component extending between 300 nm and 700 nm is efficiently absorbed by the photovoltaic cell, achieving volume heating of the photovoltaic cell. Thermalisation of the photovoltaic cell is no longer from one face to the other but from the volume of the photovoltaic cell to each face. The first and second faces of the photovoltaic cell thus have approximately equal temperatures. The curing of the conductive paste is therefore achieved in the same way, regardless of the face on which it is arranged.

By substantially equal temperature, it is meant, for example, ±5%.

Moreover, the first radiation component also allows for a thermal treatment of the photovoltaic cell that improves its energy conversion efficiency. Indeed, the photovoltaic cell may include a density of defects before the first exposure, such as dangling bonds or metal ions, negatively affecting the energy conversion. These defects promote recombination of electron-hole pairs, reducing the electric current generated by the photovoltaic cell. On the other hand, the photovoltaic cell energy conversion efficiency is improved by a few percent through the combined action of electromagnetic radiation and temperature. This phenomenon, known as "light soaking", tends to minimise electron-hole recombinations by reducing the density of defects in the photovoltaic cell.

The curing method according to the first aspect of the invention thus makes it possible to benefit from two advantageous effects through the implementation of a same radiation: achieve curing of the conductive paste and improve energy conversion efficiency of the photovoltaic cell.

Preferably, the at least one component is in the range of ]400 nm; 700 nm]. For example, it is between 410 nm and 700 nm.

Preferably, the first electromagnetic radiation comprises a first component between 300 nm and 550 nm and a second component between 700 nm and 1200 nm and preferably between 800 nm and 1100 nm.

The very short wavelengths, below 550 nm, are very energetic and are efficiently absorbed by the photovoltaic cell. They therefore allow the quality of the photovoltaic cell to be improved at the first face with high kinetics. Longer wavelengths, above 700 nm, are less efficiently absorbed by the photovoltaic cell but are absorbed throughout the thickness of the photovoltaic cell. The longer wavelengths make it possible to improve volume quality of the photovoltaic cell and also distribute heating of the photovoltaic cell.

The superposition of the first and second components, in two separate wavelength ranges, thus allows for a homogeneous heating of the photovoltaic cell and improves light soaking kinetics of the photovoltaic cell.

It is even more advantageous that the first electromagnetic radiation has a spectral irradiance between 550 nm and 700 nm that is substantially zero. Substantially zero or negligible means, for example, a spectral irradiance of less than 0.04 $W/m^2/nm$. Radiation only between 550 nm and 700 nm is absorbed efficiently, resulting in efficient heating of the photovoltaic cell. However, it is less advantageous in terms of light soaking kinetics of the photovoltaic cell. Therefore, in order to achieve curing and light soaking at a throughput compatible with industrial expectations, it is preferable that the ranges considered are distinct and strictly between 300 nm and 550 nm and between 700 nm and 1200 nm.

It is additionally more advantageous, from the point of view of light soaking kinetics, that the ranges considered are between 300 nm and 500 nm and between 800 nm and 1100 nm. In which case the first electromagnetic radiation may also comprise a spectral irradiance between 700 nm and 800 nm and also substantially zero, for example less than 0.04 $W/m^2/nm$.

By spectral irradiance, it is meant the power of electromagnetic radiation received by a unit area and per unit wavelength, which unit area is oriented perpendicular to the direction of the electromagnetic radiation. The unit of spectral irradiance is $kW/m^2/nm$.

It is additionally advantageous that the spectral irradiance of the first electromagnetic radiation is substantially zero for a wavelength of less than 300 nm. Indeed, very short wavelengths, below 300 nm, have a high risk of damage to the passivation layers, comprising for example amorphous silicon.

It is also advantageous that the spectral irradiance of the first electromagnetic radiation is substantially zero for a wavelength greater than 1200 nm, or even greater than 1100 nm. Indeed, for very long wavelengths, for example above 1100 nm, the energy is no longer efficiently absorbed and does not allow the photovoltaic cell to be properly heated and/or light soaked.

In order to control power dissipated by short wavelengths and long wavelengths, the first electromagnetic radiation advantageously comprises:
- a first irradiance, called UV irradiance, between 300 nm and 550 nm; and
- a second irradiance, called IR irradiance, between 700 nm and 1200 nm and preferably between 800 nm and 1100 nm;

the ratio of UV irradiance to IR irradiance being between 10/90 and 50/50, for example 30/70. Power dissipated by the long wavelengths thus makes it possible to heat the photovoltaic cell efficiently in volume without the short, very energetic wavelengths unbalancing this heating by concentrating too much power in the vicinity of the first surface of photovoltaic cell. This ratio of irradiances also ensures that the light soaking kinetics is equivalent to the curing kinetics of the conductive paste.

By irradiance or energy lighting or surface light power density, it is meant the power of electromagnetic radiation in a wavelength range, for example between 300 nm and 550 nm or between 700 nm and 1200 nm, received by aa area unit, this area unit being oriented perpendicular to the direction of the electromagnetic radiation. In other words, it is the integration of the spectral irradiance over one of the aforementioned wavelength ranges.

According to one implementation mode of the curing method, the first exposure step has a first exposure duration comprising a first period, a second period and a third period, that are sequential and consecutive. The first electromagnetic radiation has in this case:
- a first total irradiance during the first period;
- a second total irradiance during the second period; and
- a third total irradiance during the third period.

The first and second total irradiances are advantageously greater than or equal to the third total irradiance.

Advantageously, the duration of the first period is adjusted so that the photovoltaic cell temperature is stabilised at the end of the first period and the second total irradiance is greater than the first total irradiance.

Advantageously, the duration of the second period is less than or equal to 5 s, or even less than or equal to 3 s, for example between 2 s and 3 s.

According to the first implementation mode, the curing method may comprise a second step of exposing the first face to a second electromagnetic radiation, the second exposure step being carried out before the first exposure step, the second electromagnetic radiation having a fourth total irradiance, greater than the first total irradiance, and the second exposure step having a second exposure duration less than the first exposure duration.

The second exposure step makes it possible to further improve light soaking of the photovoltaic cell and curing of the conductive paste. It makes it possible, for example, to control the temperature rise of the photovoltaic cell by adjusting the second total irradiance and the second exposure duration.

The second electromagnetic radiation advantageously comprises at least one component between 300 nm and 700 nm.

Preferably, said at least one component is in the range of ]400 nm; 700 nm]. It is for example between 410 nm and 700 nm.

By total irradiance of an electromagnetic radiation, it is meant the irradiance of this electromagnetic radiation between 300 nm and 700 nm, that is the integration of the spectral irradiance of this electromagnetic radiation between 300 nm and 700 nm.

Advantageously, the second exposure step and the second exposure step are spaced in time. This allows, for example, to stop the temperature rise of the photovoltaic cell and/or of the portion of conductive paste treated.

Advantageously, the time interval between the start of the second exposure step and the end of the first exposure step is less than or equal to 20 s. In this way, the curing method is compatible with industrial throughput requirements even when it implements an additional exposure step.

Advantageously, the curing method comprises a third step of exposing the first face to a third electromagnetic radiation, the third exposure step being immediately consecutive to the first exposure step, the third electromagnetic radiation having a fifth total irradiance decreasing as a function of time since the third total irradiance.

According to a first alternative implementation, the conductive paste is an electrically conductive adhesive. This first alternative is additionally advantageously applicable to a heterojunction photovoltaic cell. Indeed, the curing temperature of an electrically conductive adhesive is below 250° C. and is compatible with a maximum temperature of 200° C. that a heterojunction cell can withstand. The first implementation mode also advantageously applies to a photovoltaic cell comprising a perovskite layer, called a "tandem photovoltaic cell".

Advantageously, the first, second and third total irradiances and the first exposure duration are chosen so that the portion of conductive paste has, at the end of the first exposure, a breaking strength greater than or equal to 0.5 N/mm, the breaking strength measurement preferably being carried out at a temperature of 180° C. In this way, it is ensured that the exposure parameters provide a sufficient curing level.

According to one development of the first implementation mode of the curing method, the first, second and third total irradiances and the first exposure duration are chosen such that the temperature of the photovoltaic cell is between 150° C. and 250° C. for at least 90° of the first exposure duration. In this way, the method makes it possible to maintain a production throughput in line with industrial expectations, while providing a properly cured portion of conductive paste.

In a second alternative implementation, the conductive paste is a solder paste. This second alternative applies to both homojunction and heterojunction photovoltaic cells. In addition, soldering has a better breaking strength.

According to one development of the second implementation mode of the curing method, the first, second and third total irradiances and the first exposure duration are chosen such that the portion of conductive paste has a breaking strength of more than 1 N/mm at the end of the first exposure, with the breaking strength measurement preferably being carried out at a temperature of 180° C.

This curing level of the solder paste can be achieved by selecting the first, second and third total irradiances and the first exposure duration such that the temperature of the solder paste portion is between 180° C. and 270° C. for at least 20 seconds.

According to one development of the second alternative, the second total irradiance is advantageously higher than the first and third total irradiances, the first and third total irradiances are advantageously chosen such that the temperature of the photovoltaic cell is within $[T_f-5°\,C.; T_f]$ for at least 60% of the first and third periods and the second total irradiance is advantageously chosen such that the temperature of the photovoltaic cell is greater than or equal to $T_f+10°$ C. for at least 60% of the second period.

The photovoltaic cell advantageously comprises a base and an emitter, the emitter being preferably disposed at the first face. This is because the light soaking kinetics is further improved when the emitter is exposed to the radiation.

In order to improve temperature control of the photovoltaic cell during the first exposure step, it can also be heated during the first exposure step by means of a heat source separate from the first electromagnetic radiation.

The light soaking of the photovoltaic cell can also be improved by resorting to a first radiation with a high total irradiance. However, the high total irradiance may cause the photovoltaic cell to heat up too much and may cause damage to the cell. It is therefore advantageous that the photovoltaic cell is cooled during the first exposure step. In this way, the temperature of the photovoltaic cell is controlled while at the same time increasing the light soaking kinetics of the photovoltaic cell.

The curing method according to the first aspect is advantageously implemented during the step of interconnecting a plurality of photovoltaic cells to form a photovoltaic chain.

A second aspect of the invention moreover relates to a method for manufacturing a photovoltaic chain from a first photovoltaic cell and a second photovoltaic cell, each of the first and second photovoltaic cells comprising a first face and a second face, opposite to the first face, the method comprising the following steps of:

depositing a first portion of conductive paste onto one of the first and second faces of the first photovoltaic cell;

interconnecting the second photovoltaic cell to the first photovoltaic cell by means of the first portion of conductive paste; and curing the first portion of conductive paste by means of a curing method according to the invention.

The manufacturing method enables the manufacture of a so-called "conventional" photovoltaic chain, the photovoltaic cells of which are for example connected by means of an interconnection element, such as a conductive tape or wire. The manufacturing method also makes it possible to manufacture a so-called "shingle" photovoltaic chain, in which the cells are superimposed on each other in the manner of overlapping tiles on a roof.

A first implementation mode of the manufacturing method more particularly addresses the manufacture of a shingle photovoltaic chain. According to this first implementation mode, the second photovoltaic cell overlaps the first portion of conductive paste. The first portion of conductive paste is thus sandwiched between the two photovoltaic cells. The first exposure induces heating in the volume of each photovoltaic cell and heats the first portion of conductive paste on either side, improving reproducibility of its curing.

A second implementation mode of the manufacturing method addresses the manufacture of a conventional photovoltaic chain. According to this second implementation mode, a second portion of conductive paste is disposed on one of the first and second faces of the second photovoltaic cell, the second photovoltaic cell being interconnected to the first cell by means of an interconnection element connecting the first portion of conductive paste with the second portion of conductive paste, the method also comprising a step of curing the second portion of conductive paste by means of the curing method according to the invention.

By interconnecting element, it is meant, for example, an electrically conductive element such as a metal tape or a metal wire.

A third aspect of the invention also relates to an equipment for making a photovoltaic chain from a first photovoltaic cell and a second photovoltaic cell, each of the photovoltaic cells comprising a first face and a second face, opposite to the first face, the equipment comprising:

an applicator configured to apply a first portion of conductive paste to one of the first and second faces of the first photovoltaic cell;

means for interconnecting the second photovoltaic cell with the first photovoltaic cell.

The equipment is notable for comprising a radiation source configured to expose the first face of the first photovoltaic cell to a first electromagnetic radiation comprising at least a first component between 300 nm and 700 nm.

The equipment thus makes it possible to manufacture a more reliable photovoltaic chain. Indeed, it allows curing of the conductive paste according to the first aspect of the invention, ensuring homogeneous curing, whatever the face onto which the conductive paste is deposited. The risk of the conductive paste detaching is therefore reduced.

Furthermore, the equipment is advantageous in that it can be made from equipment for manufacturing a photovoltaic chain according to prior art. For this purpose, it is sufficient to add a radiation source to obtain an equipment according to the third aspect of the invention, capable of manufacturing a reliable photovoltaic chain.

The equipment may comprise a temperature probe for determining the temperature of the portion of conductive paste and/or the photovoltaic cell during exposure to the first electromagnetic radiation. The probe thus enables the total irradiance of the first electromagnetic radiation and the first exposure duration to be selected so that the curing conditions are optimal.

The equipment may also include a test bench for determining the breaking strength of the first portion of conductive paste. The test bench may also be implemented to select the total irradiance of the first electromagnetic radiation and the first exposure duration so that the curing conditions are optimal.

The equipment may also comprise a heat source separate from the radiation source.

According to one development, the at least one first component of the first electromagnetic radiation is in the range of ]400 nm; 700 nm]. It is for example between 410 nm and 700 nm.

The invention and its different applications will be better understood upon reading the following description and examining the accompanying figures.

BRIEF DESCRIPTION OF THE FIGURES

Unless otherwise specified, a same element appearing in different figures has a single reference. The figures are set forth by way of indicating and in no way limiting purposes of the invention.

FIG. 1 schematically represents a method for manufacturing a photovoltaic module according to prior art.

FIG. 2 schematically represents an equipment for the manufacture of a photovoltaic chain according to prior art.

FIG. 3 schematically represents a first implementation mode of a method for curing a conductive paste according to a first aspect of the invention.

FIG. 4 schematically represents a first example of a first electromagnetic radiation implemented according to the method of [FIG. 3].

FIG. 5 schematically represents a second example of the first electromagnetic radiation implemented according to the method of [FIG. 3].

FIG. 6 schematically represents a second implementation mode of the method for curing a conductive paste according to the first aspect of the invention.

FIG. 7 schematically represents a third implementation mode of the method for curing a conductive paste according to the first aspect of the invention.

FIG. 8 schematically represents a first implementation mode of a method for manufacturing a photovoltaic chain according to a second aspect of the invention.

FIG. 9 schematically represents a second implementation mode of the manufacturing method according to the second aspect of the invention.

FIG. 10 schematically represents a third implementation mode of the manufacturing method according to the second aspect of the invention.

FIG. 11 schematically represents a fourth implementation mode of the manufacturing method according to the second aspect of the invention.

FIG. 12 schematically represents a fifth implementation mode of the manufacturing method according to the second aspect of the invention.

FIG. 13 schematically represents an example of an equipment according to a third aspect of the invention for manufacturing a photovoltaic chain.

DETAILED DESCRIPTION

The invention, in to its different aspects, will now be described with reference to [FIG. 3] to [FIG. 13].

FIG. 3] and [FIG. 4] schematically represent a first implementation mode of a method for curing 3 a portion of conductive paste 5 disposed on a photovoltaic cell 4.

Said curing method 3 makes it possible to carry out curing of the portion of conductive paste 5 in a homogeneous manner, regardless of the face onto which said portion of conductive paste 5 is deposited.

The photovoltaic cell 4, which will also be referred to simply as a cell, is for example a silicon heterojunction or a silicon homojunction cell.

The cell 4, when it is a silicon heterojunction cell, comprises for example:
- a crystalline silicon substrate doped with a first type, for example n-type;
- a passivation layer of intrinsic hydrogenated amorphous silicon, disposed on each face of the substrate;
- a layer of doped amorphous silicon, disposed on each of the passivation layers; and
- a layer of transparent conductive oxide (TCO), disposed on each of the doped amorphous silicon layers;
- metallisations, for example silver-based metallisations, disposed on each layer of transparent conductive oxide, forming for example collection electrodes or a current aggregator, known as a "busbar".

The cell 4 is obtained, for example, by implementing the first three steps 11, 12, 13 of the method according to prior art of [FIG. 1]. The cell 4 as set forth is capable of generating an electric current when exposed to electromagnetic radiation, for example solar radiation.

One of the doped amorphous silicon layers is doped with the first type, n-type in the example, and the other layer is doped with a second type, different from the first, p-type in the example. A junction, and in this case a heterojunction, is formed by the crystalline silicon substrate doped with the first type and the amorphous silicon layer doped with the second type, this layer forming an emitter of the cell 4. The doped crystalline silicon substrate of the first type then forms a base of the cell 4.

The crystalline silicon substrate may be n-type or p-type doped. When the crystalline silicon substrate is n-type doped, only donor-type doping impurities (for example phosphorus atoms) have been intentionally introduced into the crystalline silicon of the substrate in order to change its electrical conductivity. Further to donor type dopant impurities, the substrate may contain unintentional (and therefore trace) acceptor dopant impurities (such as boron atoms). The concentration of acceptor type dopant impurities $N_A$ in the substrate is advantageously less than $10^{13}$ cm$^{-3}$, preferably less than $3 \cdot 10^{12}$ cm$^{-3}$. The concentration of donor-type dopant impurities $N_D$ is preferably greater than 50 times the concentration of acceptor-type dopant impurities $N_A$ (or $N_D/N_A > 50$). Similarly, when the crystalline silicon substrate is p-doped, only acceptor type dopant impurities have been intentionally introduced, such as boron, gallium or indium atoms.

Each passivation layer may be of hydrogenated amorphous silicon, preferably intrinsic, that is not intentionally doped. Intrinsic hydrogenated amorphous silicon indeed provides better chemical passivation of crystalline silicon surfaces than doped hydrogenated amorphous silicon.

The n-type doped amorphous silicon layer is, for example, doped by introducing donor impurities, such as phosphorus atoms. In the same way as the substrate, further to donor type doping impurities, said doped amorphous silicon layer may unintentionally contain acceptor type doping impurities, in trace amounts.

The cell 4 comprises a first face 4a and a second face 4b, opposite to the first face 4a. Each face of the cell 4, when it is a heterojunction cell, then exposes an OCT layer and metallisations.

The first face 4a of cell 4 is defined here as the face of cell 4 exposed to electromagnetic radiation to cure a portion of conductive paste 5. The emitter of the photovoltaic cell 4 may be disposed at the first face 4a or the second face 4b of the cell 4. In other words, the base or emitter of the cell 4 may be disposed at the first face 4a. The cell 4 may thus have its base or emitter to said electromagnetic radiation.

A portion of conductive paste 5 is disposed on one of the first and second faces 4a, 4b of the cell 4. In the example of [FIG. 3], this is the first face 4a. By disposed on one face, it is meant that the portion of conductive paste is in contact with the face. For example, it has been applied to a part of said face and is at least partially wetted on said face.

The conductive paste 5 is for example an Electrical Conductive Adhesive (ECA). An electrically conductive adhesive comprises, for example, a material capable of curing during a heat treatment lasting a few seconds. This can be referred to as thermo-crosslinking or thermo-curing. Said thermo-crosslinkable material is for example an organic material based on silicone, epoxy and/or acrylate. The thermo-crosslinkable material is loaded with an electrically conductive material such as a conductive particle powder, for example silver particles. The duration of the thermo-crosslinking of the electrically conductive adhesive may depend on the temperature to which it is exposed. A chart or law relating the thermo-crosslinking time to the temperature of the electrically conductive adhesive may for example be provided by the manufacturer of the electrically conductive adhesive in question.

The thermo-curing time can also be obtained by using a Differential Scanning calorimetry (DSC) measurement. A DSC measurement makes it possible to measure the transition temperature, that is the cross-linking temperature, of the adhesive, as well as the cross-linking enthalpy, for knowing the cross-linking throughput of the adhesive. A DSC measurement can be supplemented by an analytical or numerical simulation calculator to estimate the cross-linking kinetics.

An electrically conductive adhesive is particularly adapted to a silicon heterojunction cell 4 because its thermo-crosslinking temperature is below 250° C., for example between 150° C. and 250° C.

The conductive paste 5 can be partly disposed on metallisations of the cell 4 in order to create a proper electrical contact. It can also be partially in contact with the transparent conductive oxide, especially when it is an electrically conductive adhesive, as the latter show better adhesion to said oxide.

The conductive paste 5 may also be a solder paste. A solder paste typically comprises a matrix filled with metal particles and has a melting temperature $T_f$. It is capable of melting or glass transitioning upon heat treatment, such as annealing, for a few seconds at a temperature of at least about ten degrees above the melting temperature $T_f$. The solder paste comprises, for example, a bismuth-based alloy such as SnBiAg, or a lead-based alloy such as SnPb or SnPbAg, or a lead-free alloy, for example a tin-based alloy, such as SnAg or SnAgCu. These alloys have a melting temperature $T_f$ of between 140° C. and 220° C. and melt, at least partially, during a heat treatment of a few seconds at a temperature of between 150° C. and 270° C. and more efficiently at a temperature of between 180° C. and 270° C. The treatment temperature for melting the paste 5 exceeds, for example, the melting temperature of the respective alloy by at least 10° C. Preferably, the treatment temperature is greater than or equal to $T_f+15°$ C., or even greater than or equal to $T_f+25°$ C.

The conductive paste 5, when it is a solder paste, is preferably disposed on metallisations of the cell 4 because it shows a better adhesion on the metallised parts.

The curing method 3 comprises a first step of exposing 31 the first face 4a of the photovoltaic cell 4 to a first electromagnetic radiation 310 comprising at least one component 3100 between 300 nm and 700 nm.

The cell 4 is for example placed under an electromagnetic radiation source 91 configured to emit the first electromagnetic radiation 310. Said source 91 is, for example, a set of light-emitting diodes known as LEDs, or a xenon lamp filtered to allow only the component 3100 to pass therethrough. The first face 4a of the cell 4 is then oriented towards the electromagnetic radiation source 91.

[FIG. 4] schematically represents an example of the first electromagnetic radiation 310 as it may be implemented by the curing method 3. The figure represents a spectral irradiance curve $I(\lambda)$ of the first radiation 310 as a function of wavelength $\lambda$, between 300 nm and 700 nm. The spectral irradiance $I(\lambda)$ is given in $kW/m^2/nm$. In this example, the first radiation comprises a single component 3100 having a non-zero spectral irradiance over a restricted range between 300 nm and 700 nm.

For the purposes of the invention, a component, also called a line, is a restricted frequency range around a central frequency, the spectral irradiance over said restricted range being non-zero, for example greater than 0.04 $W/m^2/nm$. The restricted frequency range preferably extends over less than 10 nm. The component 3100 illustrated in [FIG. 4] is not to scale.

The curing method 3 thus makes it possible to eliminate the need for heating plates to perform heating of the cell 4. Heating of the cell 4 is achieved by virtue of the first electromagnetic radiation 310 which is absorbed by the cell 4.

The component 3100 between 300 nm and 700 nm is efficiently absorbed, especially in a silicon heterojunction cell. The first radiation 310 thus efficiently heats the cell 4. The temperature rise of the cell 4 during the first exposure 31 can therefore be rapid, making the curing method 3 compatible with an industrial throughput.

Energy deposited in the cell 4 may be concentrated in the vicinity of the first face 4a of the cell 4, which is exposed to the first radiation 310. Especially at a wavelength of 300 nm, the first radiation 310 is substantially absorbed over a few hundred nanometres or even one micrometre. However, the component 3100, even near the short wavelengths (300 nm), is of interest compared to heating with a heating plate. Indeed, energy is directly absorbed in the bulk of the cell 4, even if it is close to the first face 4a. Conductive thermalisation is therefore improved with respect to heating by thermal contact with a heating plate. Furthermore, energy is homogeneously absorbed by the cell 4, regardless of the flatness or roughness of the first face 4a, whereas thermal contact of the latter with a heating plate may be of lesser quality, creating hot and cold spots. Heat is therefore more homogeneously propagated in the cell 4 when it comes from the first electromagnetic radiation 310.

Advantageously, the component 3100 of the first electromagnetic radiation 310 is in the range of ]410 nm; 700 nm], for example between 410 nm and 700 nm. This range allows proper energy absorption and homogeneously distributed absorption in the cell 4.

The component 3100 near the centre of the range provided, for example between 550 nm and 700 nm, may have a good compromise between efficient energy absorption and homogeneous absorption within said cell 4.

The first electromagnetic radiation has a double interest in that it also allows the cell 4 to be light soaked. By light soaking, it is meant the improvement of the energy conversion efficiency of the cell 4. The first electromagnetic radiation 310 reduces the density of defects in the cell 4, reducing the density of recombination centres, which are detrimental to the conversion of electromagnetic radiation into electric current.

Exposure to the first radiation significantly improves passivation of amorphous silicon layers overlying a crystalline silicon substrate. It also improves series resistance between the layers forming the cell 4.

The closer the component 3100 is to the short wavelengths, that is 300 nm, the faster the light soaking. On the other hand, most of the light soaking takes place in the vicinity of the first face 4a.

The closer the component 3100 is to long wavelengths, that is 700 nm, the slower the light soaking. On the other hand, the first radiation 310 is more homogeneously absorbed along the thickness of the cell 4, homogenising light soaking of the cell 4 along its thickness.

The component 3100 in the range of ]410 nm; 700 nm] allows rapid light soaking at the first face 4a of the cell while allowing homogeneous light soaking in the cell 4.

A neighbouring component 3100, for example between 550 nm and 700 nm, offers a good compromise between rapid and homogeneous light soaking over the thickness of the cell 4.

The first radiation 310 may comprise a plurality of components, extending between 300 nm and 700 nm, each component contributing to the homogenisation and improvement of the curing of the conductive paste and also the light soaking of the cell 4. According to one development, the first radiation 310 comprises a plurality of components, extending between 410 nm and 700 nm.

Moreover, [FIG. 5] represents another example of the first electromagnetic radiation 310 as may be implemented by the curing method 3 and comprising a plurality of components. [FIG. 5] represents the spectral irradiance $I(\lambda)$ of the first radiation 310 as a function of wavelength $\lambda$, between 300 nm and 1200 nm. The spectral irradiance $I(\lambda)$ is also given in $kW/m^2/nm$.

In this example, the first radiation 310 comprises:
 a first component belonging to the wavelength range extending between 300 nm and 550 nm, said range being for example referred to as the ultraviolet range or abbreviated "UV" or also referred to as the blue range;
 a second component belonging to the wavelength range between 700 nm and 1200 nm, said range being referred to as the infrared or IR range; and The first and second components 3101, 3102 belong to different ranges respectively, for combining the effects of each range. The first component improves light soaking kinetics of the cell 4, especially at the first surface 4a, and efficiently heats the cell 4. The second component, with a wavelength between 700 nm and 1200 nm, is absorbed throughout the thickness of the cell. It therefore light soaks the cell 4 along its thickness and homogenises heating of the cell 4 along its thickness. Thus, homogenisation of the curing of the conductive paste 5 and light soaking of the cell 4 are optimised.

The second component is advantageously between 800 nm and 1100 nm, thus improving light soaking and curing. Indeed absorption is higher at 1100 nm than at 1200 nm. The second component is also more homogeneously absorbed at 800 nm than at 700 nm.

The spectral irradiance in the range between 550 nm and 700 nm and preferably between 550 nm and 800 nm is advantageously negligible or even zero. The spectral irradiance is considered negligible when it is less than 0.04 W/m²/nm, that is less than $40 \cdot 10^{-6}$ kW/m²/nm. A third component between 550 nm and 700 nm would be efficiently absorbed, allowing for efficient heating of the photovoltaic cell. However, it is less advantageous in terms of light soaking kinetics of the photovoltaic cell with respect to the first component, which belongs to the UV range (also called blue range). It is therefore preferable, in order to achieve curing and light soaking at a throughput compatible with industrial production requirements, to combine effects obtained by components belonging to the UV and IR ranges, rather than choosing a single component belonging to an intermediate range.

A first instantaneous total irradiance I(t) of the first radiation 310 can be determined, the unit of which is kW/m². The first total instantaneous irradiance I(t) is equal to the integral of the spectral irradiance of the first radiation 310 over a given spectral range, for example the range [300; 1200] nm. The first exposure 31, and thus the curing method 3, is effective when the first instantaneous total irradiance I(t) is for example greater than or equal to 1 kW/m². It is improved when the first total instantaneous irradiance I(t) is greater than or equal to 5 kW/m². It is for example between 1 kW/m² and 200 kW/m².

According to one alternative of the present example, the first radiation 310 may also have:
- a first irradiance $I_{UV}$, referred to as UV irradiance, determined over the UV range; and
- a second irradiance $I_{IR}$, referred to as IR irradiance, determined over the IR range.

When the spectral irradiance in the third range is negligible, the first total instantaneous irradiance I(t) is equal to the sum of the UV irradiance and the IR irradiance.

The first exposure 31 is improved when a ratio of UV irradiance to IR irradiance, that is $I_{UV}/I_{IR}$, is advantageously between 10/90 and 50/50.

FIG. 6] schematically represents the total instantaneous power I(t), (in kW/m²) to which the cell 4 is exposed, as a function of time t (in seconds). FIG. 6] represents, in continuous lines, the total instantaneous power I, whose ordinate is on the left. It also represents, in dashed lines, an example of the instantaneous temperature T(t) of cell 4 as a function of time t.

During the first exposure step 31, which takes place over a duration $d_{123}$, the total instantaneous power I(t) varies according to a series of periods which take place sequentially and consecutively. The first step 31 thus comprises a first period $d_1$, a second period $d_2$ and a third period $d_3$. Each period $d_1$, $d_2$, $d_3$ is associated with an instantaneous total irradiance, also known simply as total irradiance, during said period. Thus, during the first period $d_1$, the first radiation 31 has a first total irradiance $I_1$. During the second period $d_2$, the first radiation 31 has a second total irradiance $I_2$. And during the third period $d_3$, the third radiation 31 has a third total irradiance $I_3$.

The first, second and third irradiances $I_1$, $I_2$, $I_3$ may have different values. However, curing is improved when the first and/or second total irradiances $I_1$, $I_2$ are greater than or equal to the third total irradiance $I_3$. In the example of [FIG. 6], the second total irradiance $I_2$ is higher than the first and third total irradiances $I_1$, $I_3$, the latter being equal. This configuration, where the second total irradiance $I_2$ is higher, can be called overshoot. The overexposure discussed below allows the temperature of the cell 4 to be temporarily increased in order to, for example, accelerate curing of the paste or to facilitate adhesion of the paste portion when it is a solder paste.

FIG. 6] also represents one embodiment in which the curing method 3 comprises a second exposure step 32 of the cell 4. This is the exposure of the first face 4a to a second electromagnetic radiation. The second step 32 makes it possible to initiate the heat treatment of the cell 4 and the portion of conductive paste 5. It can be called the initiation or "ramp up" step. The second exposure step 32 is performed before the first exposure step 31.

The first and second exposure steps 31, 32 may be separated in time from each other, whereby the cell 4 does not receive any electromagnetic radiation to cure the conductive paste or to light soak the cell 4 for a duration $d_6$. The duration $d_6$ is for example less than or equal to 1 s.

The second radiation comprises, in the same way as the first radiation 310, at least one component between 300 nm and 700 nm. It may also have one or more of the additional characteristics of the first radiation 310, such as those described with reference to [FIG. 4] and [FIG. 5], in particular a first component in the UV range and a second component in the IR range. The second radiation differs from the first radiation 310 in that it comprises:
- a fourth total irradiance $I_4$, different from the first total irradiance $I_1$; and
- a second exposure duration $d_4$, different from the first exposure duration $d_{123}$.

In [FIG. 6], the fourth total irradiance $I_4$ is greater than the first total irradiance $I_1$. The fourth total irradiance $I_4$ is for example equal to 50 kW/m² while the first total irradiance $I_1$ is equal to 10 kW/m². The second exposure duration $d_4$ is shorter than the first exposure duration $d_{123}$. The second exposure duration $d_2$ is, for example, less than or equal to 2 seconds while the first exposure duration $d_{123}$ is less than or equal to 20 seconds.

The second exposure step 32 makes it possible for example to reduce the complete treatment duration by improving temperature rise of the cell 4, for reducing the first exposure duration $d_{123}$.

Advantageously, the time interval between the start of the second exposure step 32 and the end of the first exposure step 31 is less than or equal to 20 s. In other words, the sequence of the two steps is equal to:

$$d_{123}+d_6+d_4 \leq 20 \text{ s}$$

The second radiation may also comprise, in the same way as the first radiation 310, at least one component within ]400 nm; 700 nm], for example between 410 nm and 700 nm.

In the implementation mode shown in [FIG. 6], the curing method 3 also comprises a third step 33 of exposing the first face 4a to a third electromagnetic radiation. The third exposure step 33 is immediately subsequent to the first exposure step 31. It especially ensures controlled cooling of the cell 4 by controllably reducing the total irradiance to which the cell 4 is exposed. For this, the third electromagnetic radiation has a fifth total irradiance which decreases as a function of time, preferably monotonically. It varies, for example, from the third total irradiance $I_3$ to a zero value. The third exposure step 33 preferably has a duration of 10 s or less. In this way, the total duration of the method can be less than or equal to 30 s and remain compatible with an industrial throughput. The third exposure step 33 makes it possible, above all, to slow down cooling of the cell 4 in order to reduce thermal stresses within the cell 4 and the portion of conductive paste 5.

The third electromagnetic radiation advantageously has the same spectral characteristics as the first electromagnetic radiation 310. That is, it comprises at least one component between 300 nm and 700 nm. According to one development, it may comprise at least one component between ]400 nm: 700 nm], for example between 410 nm and 700 nm.

According to one alternative, the curing method 3 does not comprise the third exposure step 33. In this case, the cooling of the cell 4 is fast. When the conductive paste 5 is a solder paste, the fast cooling allows the solder paste 5 to be quenched during its solidification. The fast cooling can also be accelerated by implementing forced convection, such as the result of a gas jet directed towards the cell 4.

It is advantageous to characterise a variation in a physicochemical property of the conductive paste 5 to determine whether said paste is sufficiently cured or not. For example, said physicochemical property may be a higher breaking strength of a portion of the cured conductive paste 5. For example, the conductive paste 5 may be considered sufficiently cured when its breaking strength, for example measured at a temperature of 180° C., is greater than or equal to 0.5 N/mm. This level of breaking strength is, for example, sufficient for implementation in a photovoltaic circuit. In order to be able to compare the measurements with each other, the breaking strength is indicated per unit width of the paste portion, along a direction advantageously perpendicular to the direction of tension exerted on the conductive paste. When an interconnecting wire or tape is bonded or soldered to the paste portion and a tension is exerted on the wire/tape, the width considered is for example the width of the wire/tape. The unit is N/mm.

The measurement or determination of said physicochemical property also allows the dimensioning of some characteristics of the curing method 3, for example related to the first exposure 31. For example, it is advantageous to determine the total instantaneous irradiance I(t) as a function of time of the first radiation 310 and the first exposure duration $d_{123}$ to the first radiation 310 so that the breaking strength of the portion of conductive paste 5 is greater than or equal to a threshold.

The inventors carried out initial tests, the main results of which are gathered in [Table 1] below, in order to determine the efficiency of curing of the conductive paste when implementing the curing method 3. The protocol implemented in the tests makes it possible, for example, to choose the first, second and third total irradiances $I_1$, $I_2$, $I_3$ of the first radiation 310 and the first exposure duration $d_{123}$ to the first radiation 310 so that the breaking strength of the portion of conductive paste 5, measured at a temperature of 180° C., is greater than or equal to 0.5 N/mm.

The first tests have been carried out on the first seven cells, indicated 1 to 7 in the "CEL" column. The tests concerned silicon heterojunction cells 4 comprising an n-type doped substrate. The conductive paste 5 considered was an electrically conductive adhesive Henkel Loctite 8282™, comprising an acrylate base filled with silver particles. The curing temperature of the adhesive is 170° C. A portion of electrically conductive adhesive 5 has been deposited onto the first face 4a of each cell 4, that is the face exposed to the first radiation 31. A metal tape was applied against each first portion of electrically conductive adhesive 5 so that a breaking strength measurement of the cured adhesive could be made. The breaking strength measurements have been made by applying a tensile force to each metal tape after the adhesive portions had cured, until a break was observed. Breaking strength values are given in N/mm in the "T" column. The strength values are given in the form of a range because the measurement means implemented has a sampling range of 0.1 N/mm to 0.2 N/mm.

The type of break is also indicated in the "Break" column, which can be both adhesive and cohesive. By adhesive breaking, it is meant that breaking occurs between the cell and the cured adhesive portion, with the adhesive portion completely detaching from the cell. By cohesive breaking, it is meant that breaking occurs in the cured adhesive portion, the adhesive portion separating into at least two parts, one part remaining attached to the cell and the other part remaining attached to the tape. Breaking may be of an adhesive and cohesive nature where at least one part of the adhesive portion detaches from the cell and another part of said adhesive separates into at least two.

As the adhesive is disposed on the first face 4a, it is also on the face receiving the first radiation 310. The heterojunction cells 4 have been oriented ("Orient." column) by having their base, indicated "COL", or their emitter, indicated "EM". Thus, the base of cells no 1, no 2, no 4 and no 5 has been exposed to the first radiation 310 while the emitter of samples no 3, no 6 and no 7 has been exposed to the first radiation 310.

The first electromagnetic radiation has a first component, belonging to the UV range, centred at 455 nm and a second component, belonging to the IR range, centred at 940 nm. The ratio of the UV/IR irradiance of the first radiation 310, indicated in "R1" column, is equal to 30/70 in each case. That is, the UV irradiance constitutes 30% of the total irradiance of the first radiation 310 and the IR irradiance constitutes 70% of the total irradiance of the first radiation 310. The first, second and third total irradiances $I_1$, $I_2$, $I_3$ are equal to an average irradiance of the first radiation 310, indicated in the column "$I_{123}$", is 10 kW/m² in each case. A first exposure duration of each cell 4 to the first radiation 310, indicated in "$d_{123}$" column, is 180 seconds for the first three cells and 30 seconds for the next four cells.

The waiting time between the application of the conductive paste 5 on the cell 4 and the first exposure 31 is short, for example preferably less than one hour and advantageously less than one minute. In the tests, said time was less than 20 s.

The breaking strength results are between 0.6 N/mm and 1.1 N/mm for the seven cells 4, regardless of the orientation of cell 4 or the exposure duration.

The breaking strength is between 0.9 N/mm and 1.1 N/mm for the first three cells 4, exposed 180 seconds to the first radiation 310, regardless of their orientation. Breaking is adhesive and cohesive in nature. The breaking strength and the nature of breaking obtained under these operating conditions are equivalent to results implementing a curing method of prior art. However, each cell shows an efficiency gain of between 0.3% and 0.4% absolute, which is not possible to obtain with a curing method of prior art.

The breaking strength is between 0.6 N/mm and 0.8 N/mm when the cells 4 have been exposed for 30 seconds to the first radiation 310, regardless of the orientation of the cell 4. The nature of breaking, however, is mainly cohesive. The breaking strength and breaking nature obtained under these operating conditions are lower than results implementing a curing method of prior art. However, these results are acceptable for interconnecting two cells in a photovoltaic chain or for the production of a photovoltaic module. On the other hand, the first exposure duration $d_{123}$ is shorter than a treatment duration according to prior art, thus allowing a high production throughput to be achieved, compatible with industrial requirements. In addition, each cell also has a gain in energy conversion efficiency of between 0.2% and 0.4% absolute, which is impossible to achieve with a method according to prior art. The gain in efficiency is, for example, between 0.2% and 0.3% absolute for a treatment time of 30 s. It is between 0.3% and 0.4% absolute for a treatment time of 180 s.

TABLE 1

| CEL | $R_1$ | $I_{123}$ (kW/m²) | $d_{123}$ (s) | Orient. | T (N/mm) | Break |
|---|---|---|---|---|---|---|
| 1 | 30/70 | 10 | 180 | COL | [0.9; 1.1] | C + A |
| 2 | 30/70 | 10 | 180 | COL | [0.9; 1.0] | C + A |
| 3 | 30/70 | 10 | 180 | EM | [0.9; 1.1] | C + A |
| 4 | 30/70 | 10 | 30 | COL | [0.7; 0.8] | C |
| 5 | 30/70 | 10 | 30 | COL | [0.6; 0.7] | A |
| 6 | 30/70 | 10 | 30 | EM | [0.6; 0.7] | C |
| 7 | 30/70 | 10 | 30 | EM | [0.5; 0.6] | A |

Thus, and as set forth in [Table 1], a first average irradiance $I_{123}$ equal to 10 kW/m² and a first exposure duration $d_{123}$ greater than or equal to 30 seconds allow a portion of conductive paste 5 to be cured so that it has a breaking strength, at the end of exposure step 31, greater than 0.5 N/mm.

The conductive paste 5 is cured when it is heat treated at a temperature above a minimum curing temperature or within a temperature range.

When the conductive paste 5 is an electrically conductive adhesive, the temperature range for curing preferably extends from 150° C. to 250° C. Therefore, the first average irradiance $I_{123}$ and the first exposure duration $d_{123}$ can be chosen such that the first exposure 31 allows the conductive paste 5 to be heated to a temperature between 150° C. and 250° C. for at least 20 seconds.

A temperature probe 94, configured to measure the temperature of the portion of conductive paste 5 may be implemented during the first exposure step. It may be used to determine the total instantaneous irradiance I(t) received by the cell 4 and the first exposure duration $d_{123}$ required to cure the portion of paste 5. The temperature probe 94 may measure the temperature of the portion of conductive paste 5 or the temperature in the vicinity of the portion of conductive paste 5. Indeed, measuring the temperature of silicon in the vicinity of the portion of conductive paste 5 may allow the temperature of the cell 4 heated by the first radiation 31 to be determined, and hence the temperature at the paste portion 5 to be determined.

The temperature probe 94 may be a direct measurement means, such as a thermocouple, or a non-contact measurement means, such as a thermal camera.

The inventors have carried out second tests under conditions similar to the first tests, in order to determine the temperature of the portion of paste 5 as a function of the average irradiance $I_{123}$ (where $I_1=I_2=I_3=I_{123}$) and the first exposure duration $d_{123}$. The main results are gathered in [Table 2] below. The $I_{UV}/I_{IR}$ ratio is especially equal to 30/70.

However, the second tests differ from the first tests in that the cells 4 tested have a thickness of 160 μm, which was standard at the time of filing of the present application. In addition, the temperature of the portion of conductive paste 5 has been measured by means of a K-type thermocouple in contact with the cell. A thermal camera can also be used.

The results in [Table 2] show the temperature in degrees Celsius obtained in further tests, as a function of the average irradiance $I_{123}$ and the first exposure duration $d_{123}$. A temperature higher than 150° C., allowing for example curing of the conductive paste 5, is obtained for an average irradiance $I_{123}$ equal to or higher than 8.5 kW/m² and a first exposure duration $d_{123}$ equal to 30 s. A linear interpolation of the results makes it possible to determine that an average irradiance $I_{123}$ greater than or equal to 7 kW/m² and a first exposure duration $d_{123}$ equal to 30 s make it possible to reach a temperature of 150° C. The values given in the table may vary according to the properties of the cell 4, especially its thickness.

The temperature of cell 4 is measured by means of a thermocouple placed on the surface 4a of the cell 4 illuminated. The temperatures and durations measured depend on the heat exchange between the cell 4 and an external environment. In this case the cell 4 is suspended in the ambient air and at an initial ambient temperature. The cell 4 reaches the target temperature in about 20 s. The cell 4 could of course be in contact with a regulated thermal mass in order to increase or reduce the time required to heat the cell 4.

TABLE 2

| T (° C.) | $I_{123}$ (kW/m²) | $d_{123}$ (s) |
|---|---|---|
| 120 | 4.3 | 30 |
| 140 | 6 | 30 |
| 180 | 8.5 | 30 |
| 220 | 11.5 | 30 |

According to another example, when the conductive paste 5 is a solder paste, as previously described, it has a melting temperature $T_f$ which may be between 140° C. and 220° C. The first, second and third total irradiances $I_1$, $I_2$, $I_3$ and the first exposure duration $d_{123}$ (including each of the first, second and third periods $d_1$, $d_2$, $d_3$) are preferably chosen so that the first exposure step 31 enables the melting and solidification of the conductive paste 5 and at the same time the light soaking of the underlying cell 4.

For this, the curing method 3 provides, according to one embodiment, for carrying out a first exposure step 31 during which the second total irradiance $I_2$ is higher than the first and third total irradiances $I_1$, $I_3$, the latter being equal, for example. This operating mode is partly illustrated in [FIG. 6]. The first total irradiance $I_1$ is in particular chosen so that the temperature of the photovoltaic cell 4 is lower than the melting temperature considered and especially between $T_f-5°$ C. and $T_f$ during at least part of the first period $d_1$ of the first exposure 31 for example during at least 60% of the first period $d_1$, or even during at least 80% of the first period $d_1$. Thus, during the first period $d_1$, the portion of conductive paste 5 is brought to a temperature close to its melting temperature $T_f$. In addition, the duration of the first period $d_1$ allows the temperature within the cell 4 and the portion of solder paste 5 to stabilise. By stabilise, it is meant that the temperature of the cell 4 varies by less than 5° C. from its equilibrium temperature during at least 50% of the first period $d_1$. By equilibrium temperature, it is meant the temperature that the cell 4 would have at the end of a very long or even infinite waiting time.

The second total irradiance $I_2$ is especially chosen so that the temperature of the photovoltaic cell 4 is greater than or equal to $T_f+10°$ C. during at least 60% of the second period $d_2$, or even during at least 80% of the second period $d_2$. The second period $d_2$ thus allows melting of the conductive paste 5. The second period $d_2$ is advantageously short, in order to limit total heating of the cell 4 and limit its thermal budget. The duration of the second period $d_2$ is advantageously less than or equal to 5 s and preferably less than or equal to 3 s, for example between 2 s and 3 s.

At the end of the second period $d_2$, the third total irradiance $I_3$ is chosen so that the temperature of the photovoltaic cell 4 is lower than the melting temperature considered and more particularly between $T_f-5°$ C. and $T_f$ during at least part of the third period $d_3$ and preferably during at least 60% of the third period $d_3$, or even during at least 80% of the third period $d_3$. Thus, the third period $d_3$ allows the cooling and solidification of the conductive paste 5. The temperature of the cell 4 still remains close to the melting temperature $T_f$ during the third period $d_3$ so that mechanical stresses in the cell 4 and/or the portion of conductive paste 5 can be balanced.

The first and third periods $d_1$, $d_3$ also allow a total instantaneous irradiance to be maintained at a level that is high but does not exceed the melting temperature in an uncontrolled manner and compromise curing of the portion of conductive paste 5 on the cell 4. Since the total instantaneous irradiance is high, the light soaking kinetics are also high.

The example of implementation of the method 3 is here applied to a solder paste. However, it is of interest when the conductive paste 5 is an electrically conductive adhesive. However, the first, second and third total irradiances $I_1$, $I_2$, $I_3$ must be chosen so that the temperature of the cell 4 is maintained in a temperature range that allows the adhesive to be cross-linked for at least 60% of each period $d_1$, $d_2$, $d_3$. The second irradiance $I_2$, which is higher than the first and third irradiances $I_1$, $I_3$, makes it possible to accelerate cross-linking of the adhesive while controlling the thermal budget of the cell 4. The method is compatible with an industrial throughput.

In order to limit impact on the thermal budget of the cell 4, it is advantageous to control the temperature of said cell, for example by means of the temperature probe. The first, second and third total irradiances $I_1$, $I_2$, $I_3$ and the first, second and third exposure periods $d_1$, $d_2$, $d_3$ are, for example, chosen so that the temperature of the cell 4 is below 250° C. during the first exposure step 31.

The inventors carried out third tests, implementing a second exposure step 32. The main results are gathered in [Table 3] below. The third tests have been carried out on seven second cells, no 8 to no 14 in the "CEL" column. The operating conditions of the third tests are similar to the operating conditions of the first tests.

However, unlike the first tests, the base of cells no 8, no 9, no 10 and no 11 has been exposed to the first and second radiation 310, while the emitter of samples no 12, no 13 and no 14 has been exposed to the first and second radiation 310.

The second electromagnetic radiation also has a first component, belonging to the UV range, centred at 455 nm and a second component, belonging to the IR range, centred at 940 nm. The ratio of the UV/IR irradiances of the first radiation 310 and second radiation are indicated in columns "$R_1$" and "$R_4$" respectively, and are equal to 30/70 for cells no 9 to 14 and 50/50 for cell no 8. That is, in the latter case, the UV irradiance constitutes 50% of the total irradiance of the radiation and the IR irradiance constitutes 50% of the total irradiance of the radiation. The average total irradiance $I_{123}$ (where $I_1=I_2=I_3=I_{123}$) of the first radiation 310 is 10 kW/m² for cells no 9 to no 14 and 38 kW/m2 for cell no 8. The total irradiance $I_4$ of the second radiation is 50 kW/m² for cells no 9 to no 14 and 200 kW/m² for cell no 8.

The first exposure duration $d_{123}$ of each cell to the first radiation 310 is here 10 seconds. The second exposure duration $d_4$ of each cell to the second radiation is 2 seconds.

The results gathered in [Table 3] show that the breaking strength is constant and cohesive in nature. The breaking strength is between 0.7 N/mm and 0.8 N/mm when the cells 4 have been exposed for 2 seconds to the second radiation and only 10 s to the first radiation 310, regardless of the orientation of cell 4. The nature of breaking, however, is predominantly cohesive. The breaking strength and breaking nature obtained under these operating conditions is improved compared to the results in [Table 1] and better than the results implementing a curing method of prior art. The cells 4 treated according to this operating mode are good candidates for interconnection with a photovoltaic chain or for making a photovoltaic module. Furthermore, the total exposure duration of approximately 12 seconds is significantly less than a treatment duration according to prior art, thus allowing a high production throughput compatible with industrial requirements. The cells also show a gain in energy conversion efficiency of between 0.2% and 0.4% absolute.

TABLE 3

| CEL | $R_4$ | $I_4$ (kW/m²) | $d_4$ (s) | $R_1$ | $I_{123}$ (kW/m²) | $d_{123}$ (s) | Orient. | T (N/mm) | Break |
| --- | --- | --- | --- | --- | --- | --- | --- | --- | --- |
| 8 | 50/50 | 200 | 2 | 50/50 | 38 | 10 | COL | [0.7; 0.8] | C |
| 9 | 30/70 | 50 | 2 | 30/70 | 10 | 10 | COL | [0.7; 0.8] | C |
| 10 | 30/70 | 50 | 2 | 30/70 | 10 | 10 | COL | [0.7; 0.8] | C + A |
| 11 | 30/70 | 50 | 2 | 30/70 | 10 | 10 | COL | [0.7; 0.8] | C |
| 12 | 30/70 | 50 | 2 | 30/70 | 10 | 10 | EM | [0.7; 0.8] | C |
| 13 | 30/70 | 50 | 2 | 30/70 | 10 | 10 | EM | [0.7; 0.8] | C |
| 14 | 30/70 | 50 | 2 | 30/70 | 10 | 10 | EM | [0.7; 0.8] | C |

The inventors have performed fourth tests, in order to determine the temperature of the portion of paste 5 as a function of the first irradiance $I_1$, the first exposure duration $d_1$, the second irradiance $I_4$ and the second exposure duration $d_4$. The main results are gathered in [Table 4] below. The operating conditions for the fourth tests are similar to the second tests (described with reference to [Table 2]) with the difference that method 3 implements a second exposure step 32.

The results in [Table 4] show the temperature in degrees Celsius obtained as a function of the first irradiance $I_1$, the first exposure duration $d_{123}$, the second irradiance $I_4$ and the second exposure duration $d_4$. The temperature rise of the cell 4 is faster, for example it reaches the target temperature at the end of the second exposure duration $d_4$. Thus, the duration for which it has a temperature that allows curing of the conductive paste 5 is increased.

TABLE 4

| T (° C.) | $I_4$ (kW/m$^2$) | $d_4$ (s) | $I_1$ (kW/m$^2$) | $d_1$ (s) |
|---|---|---|---|---|
| 120 | 50 | 0.9 | 4.3 | 29 |
| 140 | 50 | 1 | 6 | 29 |
| 180 | 50 | 1.2 | 8.5 | 29 |
| 220 | 50 | 1.5 | 11.5 | 29 |

[FIG. 7] schematically represents a second implementation mode of the curing method 3. Unlike the implementation mode in [FIG. 3], the cell 4 is also heated during the first exposure step 31 by means of a heat source 96, distinct from the first radiation 310. Thus, the temperature of the cell 4 can be further increased.

The heat source 96 is, for example, a heating support placed in contact with the second face 4b of the cell 4. In this configuration, the heat input from the short wavelengths in the vicinity of the first face 4a can be balanced by heating the second face 4b by means of the heating support. In this way, the thermal gradient that may exist between the two faces 4a, 4b can be reduced or even completely cancelled.

The cell 4 may also be heated by means of a heat source 96 during the second exposure step 32 and/or the third exposure step 33. The heat source 96 is preferably different from the first and second radiations 310.

According to an alternative implementation, the cell 4 is cooled during the first exposure step 31. For example, it is brought into thermal contact with a heat sink. An air flow may also sweep the first face 4a. The total irradiances of the first and/or second radiation 310, can thus be higher, making it possible to improve light soaking, by making it faster for example, while controlling the temperature of said cell 4.

[FIG. 8] schematically represents a method for manufacturing 6 a photovoltaic chain 71, 72, 73 from a first cell 41 and a second cell 42. Three types of photovoltaic chains 71, 72, 73 obtainable by the implementation of said method are described with reference to [FIG. 9], [FIG. 10], [FIG. 11], [FIG. 12].

[FIG. 9] represents a first implementation mode of the manufacturing method 6. Each of the first and second cells 41, 42 comprises a first face 41a, 42a and a second face 41b, 42b, opposite to the first face 41a, 42a.

The manufacturing method 6 firstly comprises depositing 61 a first portion of conductive paste 51 onto the first face 41a of the first cell 41. The first portion of conductive paste 51 is, for example, screen printed on the first face 41a. The manufacturing method 6 then comprises interconnecting 62 the second cell 42 to the first cell 41. Interconnecting comprises electrically and mechanically contacting the second cell 42 to the first portion of conductive paste 51.

The interconnection 62 is, for example, achieved by means of a second portion of conductive paste 52 deposited onto the second face 42b of the second cell 42. An interconnection element 8, which may be a conductive wire or a conductive tape, is brought into contact with each portion of conductive paste 51, 52 by, for example, being pressed against each portion of conductive paste 51, 52.

In this implementation mode, the interconnection element 8 changes its plane from the second face 42b of the second cell 42 to the first face 41a of the first cell 41. This is, for example, a so-called "conventional" interconnection mode. The emitter of each cell 41, 42 is for example oriented in the same direction. The interconnection element 8 thus changes its plane to connect the cells 41, 42 in series.

The manufacturing method 6 includes a step of curing 63 the first portion of conductive paste according to the curing method 3 previously described. More precisely, curing 63 is at least achieved by the first exposure 31 of the first face 41a of the first cell 41 to the first electromagnetic radiation 310.

The manufacturing method may also include curing the second portion of conductive paste 52. For this, the first face 42a of the second cell 42 advantageously also undergoes at least the first exposure 31 to the first electromagnetic radiation 310. The second cell 42 may be exposed at the same time as the first cell 41, or at a different time.

By virtue of the curing method 3, the first and second portions of conductive paste 51, 52 can be cured homogeneously, regardless of the face on which they are disposed. The photovoltaic chain 71 obtained therefore has improved robustness. In addition, each cell 41, 42 making up said chain, exposed to the first radiation 310, has its energy conversion efficiency improved.

The first faces 41a, 42a are advantageously oriented towards the radiation source 91. In [FIG. 9], the first faces 41a, 42a of the first and second cells 41, 42 are arranged in the same plane and are oriented in the same direction, upwardly of [FIG. 9].

According to an alternative implementation, the first faces 41a, 42a of the first and second cells 41, 42 are not arranged in a same plane. For example, the first face 41a of the first cell 41 may be oriented upwardly in [FIG. 9] and the first face 42a of the second cell 42 may be oriented downwardly in [FIG. 9]. In which case, the first exposure 31 of each first face 41a, 42a is achieved using different radiation sources, for example one upwardly of [FIG. 9] and one downwardly of [FIG. 9]. However, the two different sources are configured to generate the first radiation 310.

FIG. 10] represents a second implementation mode of the manufacturing method 6. Unlike the first implementation mode, described with reference to [FIG. 9], the second portion of conductive paste 52 is disposed onto the first face 42a of the second cell 42. Thus, the interconnection element 8 remains in the same plane, passing from the first face 42a of the second cell 42 to the first face 41a of the first cell 41. This is, for example, a so-called "monolithic" interconnection mode, for reducing spacing between the interconnected cells 41, 42. The cells 41, 42 are arranged so that they alternately have their emitter or their base.

FIG. 11] represents a third implementation mode of the manufacturing method 6. Unlike the second implementation mode, described with reference to FIG. 10], the first and second portions of conductive paste 51, 52 are disposed on the second face 41b, 42b of the first and second cells 41, 42. This configuration corresponds to the one represented in [FIG. 10] but being turned over. Similarly, the interconnection element 8 remains in the same plane, passing from the second face 42a of the second cell 42 to the second face 41b of the first cell 41. This is also a monolithic interconnection mode.

By virtue of the implementation of the curing method 3, each portion of conductive paste 51, 52 is cured in an optimal manner.

[FIG. 12] represents a fourth embodiment of the manufacturing method 6. Unlike the first, second and third implementation modes, described with reference to [FIG. 9], [FIG. 10] and [FIG. 11], the interconnection 62 of the second cell 42 to the first cell 41 does not implement a second portion of conductive paste 52 or interconnection element 8. The interconnection 62 of the second cell 42 to the first cell 41 is made as a shingle, that is the first and second cells 41, 42 are superimposed on each other like tiles on a roof. The second cell 42 thus covers the first portion of conductive paste 51. The second face 42b of the second cell 42 is pressed against the first portion of conductive paste 51, for example. A zone of the first face 41a of the first cell 41, so-called "coverage zone", is masked by the second face 42b of the second cell 42. Thus, the first and second cells 41, 42 are in electrical contact.

The exposure 31 of the first and second cells 41, 42 to the first radiation 310 allows the first portion of conductive paste 51 to be heated on either side, improving homogeneity of its curing.

Unlike a method according to prior art where curing of the portion of conductive pastes and light soaking of the cells could be performed in two different steps, the manufacturing method 6 allows these steps to be combined, reducing the number of manufacturing steps.

The reduction in the number of manufacturing steps also allows for further improvement in the energy conversion efficiency of each cell. Indeed, in a manufacturing method according to prior art, cell light soaking could be achieved before screen printing of the portions of conductive paste. It could additionally be carried out several days before screen printing. This could have the consequence of delaying encapsulation of the cells (during a lamination step), reducing the effect of the previously performed light soaking and thus reducing the potential efficiency of the photovoltaic chain. Indeed, prolonged contact of the cells with air can result in a reduction of their conversion efficiency. The observed reduction can reach −0.1% in absolute terms.

In the manufacturing method 6, the light soaking takes place after screen printing of the portions of conductive paste and upon curing the latter. The chain 71, 72, 73 obtained at the end of said method 6 can thus be directly encapsulated during a lamination step so as to form a photovoltaic module. It is therefore not necessary to add an additional step before forming said module. As the time at which light soaking takes place is delayed, the time between light soaking and encapsulation of the chain (for example during lamination) is reduced. The risk of reduced conversion efficiency is therefore also reduced.

FIG. 13] schematically represents one embodiment of an equipment 9 adapted to implement the method 6 for manufacturing a photovoltaic chain 71, 72, 73 from a first cell 41 and a second cell 42.

The equipment 9 comprises an applicator 92 for applying the first portion of conductive paste 51 to one of the faces 41a, 41b of the first cell 41. The applicator 92 allows, for example, the first portion of conductive paste 51 to be screen-printed. The applicator 92 advantageously makes it possible to apply the second portion of conductive paste 52 to one of the faces 42a, 42b of the second cell 42.

The equipment 9 further comprises means 93 for interconnecting the second cell 42 with the first cell 41. Said means 93 make it possible, for example, to arrange an interconnection element 8 between the first and second portions of conductive paste 51, 52 as described with reference to [FIG. 9], [FIG. 10] and [FIG. 11]. Said means 93 may also arrange the first and second cells 41, 42 as a shingle, as described with reference to [FIG. 12]. The means 93 for interconnecting comprises, for example, cutting means for cutting a wire or tape from a spool so as to form the interconnection elements 8 and arrange them before they are interconnected to one of the cells 41, 42. Said means 93 may also comprise a mechanical arm, also provided with a suction cup, for manipulating the cells 41, 42 and arrange them between the cells between and with respect to the interconnection elements 8. Said means 93 may also comprise a conveyor, also known as a transport tape, also for arranging the cells with the interconnection elements 8.

The equipment 9 is remarkable in that it also comprises a radiation source 91 for exposing 31 the first face 41a of the first cell 41 to a first electromagnetic radiation 310 comprising at least a first component 3100 between 300 nm and 700 nm. This is, for example, a xenon lamp. Said lamp advantageously includes one or more filters transparent to the UV and IR ranges as described with reference to [FIG. 5].

The radiation source 91 may also be configured to expose 31 the first face 41a of the first cell 41 to a first electromagnetic radiation 310 comprising at least a first component 3100 within]400 nm; 700 nm], for example between 410 nm and 700 nm.

The radiation source 91 may also comprise a set of light emitting diodes or LEDs. The set of LEDs is for example configured to emit at least one component between 300 nm and 700 nm, or even in]400 nm; 700]. The set of LEDs may also include a first subset of LEDs and a second subset of LEDs so as to emit a similar first radiation 310 as described with reference to [FIG. 5]. The first subset of LEDs is for example configured to emit a first component 3101 between 300 nm and 550 nm while the second subset of LEDs is for example configured to emit a second component 3102 between 700 nm and 1200 nm and preferably 800 nm and 1100 nm.

Because the equipment 9 allows curing of the first portion of conductive paste 51 and light soaking of the first cell 41 to be carried out at the same time, it allows the radiation source 91 to be mutualised and can thus have a reduced overall size.

The equipment 9 can also be obtained from a chain manufacturing equipment according to prior art, as described with reference to [FIG. 2]. This can be achieved by adding the radiation source 91 to the equipment according to prior art, so that it can expose the first face 4a of a first cell 41 to the first radiation 310, said first cell 41 comprising a first portion of conductive paste 51 on one of its faces 41a, 41b, the first cell 41 being interconnected to a second cell 42. Thus, it is possible to convert an existing equipment into an equipment 9 according to the invention for homogenising the curing of the conductive paste and light soaking the cells 41, 42.

The equipment 9 may also comprise a transparent glass plate, for example a synthetic glass such as Plexiglas™, transparent to wavelengths between 300 nm and 700 and preferably between 300 nm and 1200 nm. The glass plate is, for example, disposed between the radiation source 91 and the first and second cells 41, 42 so as to protect the radiation source 91 from evaporation or gaseous emanations related to residues that may emanate from the cells 41, 42 heated.

The equipment 9 may further comprise a heat source 96, distinct from the radiation source 91. This may be a heating support, as set forth with reference to [FIG. 7].

The equipment 9 may also include a temperature probe 94 for determining the temperature of the portion of conductive paste 51 during exposure 31 to the first electromagnetic radiation 310.

Finally, the equipment 9 may comprise a test bench 95 for determining the breaking strength of the first portion of conductive paste 51, preferably once cured. The test bench 95 is, for example, configured to apply a tensile force between the first and second cells 41, 42 or between the first cell 41 and the interconnecting element 8 if appropriate.

The invention claimed is:

1. A method for curing a first portion of conductive paste interconnecting a first photovoltaic cell to a second photovoltaic cell, the first portion of conductive paste being disposed on the first photovoltaic cell, the first photovoltaic cell comprising a first face and a second face, opposite to the first face, the first portion of conductive paste being disposed on one of the first and second faces of the first photovoltaic cell, the second photovoltaic cell being interconnected to the first photovoltaic cell by the first portion of conductive paste, the curing method comprising a first step of exposing the first face of the first photovoltaic cell to a first electromagnetic radiation comprising a component between 300 nm and 550 nm and a second component between 700 nm and 1200 nm, wherein the first electromagnetic radiation has a spectral irradiance between 550 nm and 700 nm of less than 0.04 W/m$^2$/nm.

2. The curing method according to claim 1, wherein the first electromagnetic radiation has:
 a first UV irradiance between 300 nm and 550 nm; and
 a second IR irradiance between 700 nm and 1200 nm;
a ratio of the first UV irradiance to the second IR irradiance being between 10/90 and 50/50.

3. The curing method according to claim 1, wherein the first step of exposing the first face of the first photovoltaic cell has a first exposure duration comprising a first period, a second period and a third period, that are sequential and consecutive, and wherein the first electromagnetic radiation has:
 a first total irradiance during the first period;
 a second total irradiance during the second period; and
 a third total irradiance during the third period;
and wherein the first and second total irradiances are greater than or equal to the third total irradiance.

4. The curing method according to claim 3, wherein the duration of the first period is adjusted such that a temperature of the first photovoltaic cell is stabilised at an end of the first period and wherein the second total irradiance is greater than the first total irradiance.

5. The curing method according to claim 3, comprising a second step of exposing the first face of the first photovoltaic cell to a second electromagnetic radiation, wherein the second step of exposing the first face of the first photovoltaic cell is performed before the first step of exposing the first face of the first photovoltaic cell, wherein the second electromagnetic radiation has a fourth total irradiance which is greater than the first total irradiance, and wherein the second step of exposing the first face of the first photovoltaic cell has a second exposure duration which is shorter than the first exposure duration.

6. The curing method according to claim 5, wherein a time interval between a start of the second step of exposing the first face of the first photovoltaic cell and an end of the first step of exposing the first face of the first photovoltaic cell is less than or equal to 20 s.

7. The curing method according to claim 3, comprising a third step of exposing the first face of the first photovoltaic cell to a third electromagnetic radiation, wherein the third step of exposing the first face of the first photovoltaic cell is immediately consecutive to the first step of exposing the first face of the first photovoltaic cell, and wherein the third electromagnetic radiation has a fifth total irradiance decreasing as a function of time since the third total irradiance.

8. The curing method according to claim 3, wherein the conductive paste is an electrically conductive adhesive and wherein the first, second and third total irradiances and the first exposure duration are chosen such that a temperature of the first photovoltaic cell is between 150° C. and 250° C. for at least 90% of the first exposure duration.

9. The curing method according to claim 3, wherein the conductive paste is a solder paste having a melting temperature $T_f$, wherein the second total irradiance is higher than the first and third total irradiances, and wherein the first and third total irradiances are chosen such that the temperature of the photovoltaic cell is in the range of $[T_f-5°\ C.; T_f]$ for at least 60% of the first and third periods and the second total irradiance is chosen so that the temperature of the first photovoltaic cell is greater than or equal to $T_f+10°$ C. for at least 60% of the second period.

10. The curing method according to claim 1, wherein the first photovoltaic cell is:
 heated in the first step of exposing the first face of the first photovoltaic cell by a heat source distinct from the first electromagnetic radiation; or
 cooled during the first step of exposing the first face of the first photovoltaic cell.

11. A method for manufacturing a photovoltaic chain from a first photovoltaic cell and a second photovoltaic cell, each of the first and second photovoltaic cells comprising a first face and a second face, opposite to the first face, the method comprising:
 depositing a first portion of conductive paste onto one of the first and second faces of the first photovoltaic cell;
 interconnecting the second photovoltaic cell to the first photovoltaic cell by first portion of conductive paste; and
 curing the first portion of conductive paste interconnecting the second photovoltaic cell to the first photovoltaic cell by the curing method according to claim 1.

12. The manufacturing method according to claim 11, wherein the second photovoltaic cell covers the first portion of conductive paste.

13. The manufacturing method according to claim 11, wherein a second portion of conductive paste is disposed on one of the first and second faces of the second photovoltaic cell, the second photovoltaic cell being interconnected to the first cell by an interconnection element connecting the first portion of conductive paste with the second portion of conductive paste, the method also comprising curing the second portion of conductive paste by the curing method according to claim 1.

14. An equipment for manufacturing a photovoltaic chain from a first photovoltaic cell and a second photovoltaic cell, each of the photovoltaic cells comprising a first face and a second face, opposite to the first face, the equipment comprising:
 an applicator configured to apply a first portion of conductive paste to one of the first and second faces of the first photovoltaic cell;
 means for interconnecting the second photovoltaic cell with the first photovoltaic cell;
the equipment comprising:
 a radiation source configured to expose the first face of the first photovoltaic cell to a first electromagnetic radiation comprising at least a first component between 300 nm and 700 nm, wherein the first electromagnetic radiation has a spectral irradiance between 550 nm and 700 nm of less than 0.04 W/m$^2$/nm.

* * * * *